United States Patent
Tan et al.

(10) Patent No.: US 6,245,280 B1
(45) Date of Patent: Jun. 12, 2001

(54) METHOD AND APPARATUS FOR FORMING POLYCRYSTALLINE PARTICLES

(75) Inventors: Zhaosheng Tan; Krishna Sapru, both of Troy, MI (US)

(73) Assignee: Energy Conversion Devices, Inc., Troy, MI (US)

(*) Notice: Subject to any disclaimer, the term of this patent is extended or adjusted under 35 U.S.C. 154(b) by 0 days.

(21) Appl. No.: 09/337,289

(22) Filed: Jun. 21, 1999

(51) Int. Cl.[7] .............. H05B 6/00; H01J 37/30; H05F 3/00
(52) U.S. Cl. ............ 264/430; 264/485; 204/164; 204/298.41; 425/174; 425/174.6
(58) Field of Search .................... 264/430, 485; 204/298.41, 164; 425/174, 174.6

(56) References Cited

U.S. PATENT DOCUMENTS

| | | | |
|---|---|---|---|
| 3,232,706 | * | 2/1966 | Kuhn . |
| 4,620,913 | * | 11/1986 | Bergman ................... 204/192 R |
| 4,889,665 | * | 12/1989 | Uda et al. ........................ 264/10 |
| 5,728,195 | * | 3/1998 | Eastman et al. ................ 75/351 |
| 5,770,022 | * | 6/1998 | Chang et al. .................. 204/164 |
| 5,962,132 | * | 10/1999 | Chang et al. .................. 428/402 |
| 6,105,417 | * | 8/2000 | Nosaka et al. ................ 73/31.05 |

* cited by examiner

Primary Examiner—Christopher A. Fiorilla
(74) Attorney, Agent, or Firm—David W. Schumaker; Marvin S. Siskind (57) ABSTRACT

A method and apparatus for forming polycrystalline particles by gas phase condensation employing arc plasma evaporation. The disclosed method and apparatus may be employed to form polycrystalline particles from high-melting temperature, low evaporation pressure materials such as transition metals. Arc discharge is sustained by the evaporated species, therefore, there is no need for a plasma sustaining gas. Evaporation may be sustained from either the cathode or anode. A reaction gas may be provided to form products with the evaporated species.

16 Claims, 4 Drawing Sheets

METHOD AND APPARATUS FOR FORMING POLYCRYSTALLINE PARTICLES

FIELD OF THE INVENTION

The present invention relates to method and apparatus for the production of polycrystalline particles, and more specifically, an economical method and apparatus for forming polycrystalline particles by gas phase condensation.

BACKGROUND OF THE INVENTION

Polycrystalline particles typically have a crystallite size above about 25 nanometers and a particle size above about 50 nanometers. In the prior art, others have defined materials having a particle size between about 1–100 nanometers as nanophase, polycrystalline or nanocrystalline materials. Polycrystalline particles have demonstrated unique chemical and physical properties, such as high reactivity, enhanced infrared absorption, novel electronic properties, magnetic properties, and improved hardness and ductility. From a practical standpoint, polycrystalline materials also have potential applications in advanced information and energy technologies, as well as military applications.

Several techniques are known in the art for forming polycrystalline particles. Two general categories for polycrystalline particle processing are: 1) aqueous processing and 2) gas phase processing. Aqueous processing includes techniques such as spray conversion pyrolysis, sol gel deposition, and electrodeposition. Gas phase processing may incorporate techniques such as sputtering, laser ablation, ohmic evaporation, high-energy milling, chemical vapor condensation, and gas phase condensation. Each of the aforementioned techniques have their unique characteristics, however, each is identified by the basic processes of nucleation and growth of a crystalline structure.

In the field of gas phase condensation for the preparation of polycrystalline particles, the basic processes include evaporation of a source material or materials, nucleation of the material, and growth within a vapor phase. Typically polycrystalline materials which are produced by gas phase condensation may be formed within an inert atmosphere or in an atmosphere consisting of a mixture of inert gases and reactive gases. Within the field of gas phase condensation, there are various techniques for vaporizing materials. One such technique is electrical joule heating, also known as ohmic heating, wherein the material to be vaporized is placed in a refractory crucible and upon the application of sufficient electrical current the crucible is heated and the material is vaporized.

One method of ohmic evaporation is disclosed in U.S. Pat. No. 5,128,081 to Siegel, et al., for "METHOD OF MAKING NANOCRYSTALLINE ALPHA ALUMINA." However, one disadvantage of using ohmic evaporation, such as the technique disclosed in the '081 patent, is the temperature limitation because the source material is heated indirectly. Therefore, high melting temperature materials such as nickel are difficult to prepare according to the teachings of Siegel. There are other shortcomings associated with resistive heating for evaporation, such as a limited heat conductance rate and poor efficiency. As a result, electrical resist heating suffers from a low production rate. Furthermore, contamination of the evaporated species from the heating element and crucible materials of the heating apparatus is also a problem.

Another method known in the art for evaporation of materials for gas phase condensation is electron beam evaporation. One such method for electron beam evaporation used in gas phase condensation processing of polycrystalline particles is disclosed in U.S. Pat. No. 5,728,195 to Eastman, et. al. for "METHOD FOR PRODUCING NANOCRYSTALLINE MULTICOMPONENT AND MULTIPHASE MATERIALS," Although the '195 patent discloses a good method for evaporating different sources materials to form "nanocrystalline" particles, this approach does have its disadvantages. Electron beam techniques involve sophisticated equipment that requires a differential vacuum pumping system and a delicate electron optical system. Furthermore, electron beam evaporation is not a continuous process, which prevents it from being a suitable industry technique. Furthermore, the electron beam itself emits harmful, high-energy radiation. Another application of electron beam evaporation is disclosed in U.S. Pat. No. 4,448,802 to Buhl, et. al. for "METHOD AND APPARATUS FOR EVAPORATING MATERIAL UNDER VACUUM USING BOTH AN ARC DISCHARGE AND ELECTRON BEAM." The '802 patent discloses a technique for evaporating materials by incorporating energy from an electron gun along with a low-voltage arc discharge. Although this is an interesting approach, this device suffers from the complexities discussed regarding the '195 patent along with the additional complexity of incorporating an electron gun with an arc discharge technique for evaporation.

Another technique available for evaporation of materials for gas phase condensation is known as arc discharge, and is also referred to as arc plasma, or arc evaporation. Arc plasma is a good technique for evaporating high melting point and low vapor pressure transition metals. One apparatus for arc evaporation of materials is disclosed in U.S. Pat. No. 4,732,369 to Araya, et al. for "ARC APPARATUS FOR PRODUCING ULTRAFINE PARTICLES." Araya discloses an apparatus for forming ultrafine particles by arc evaporation that is characterized by forming a magnetic blow to an electric arc by inclining an electrode to the material to be evaporated, causing an unbalance in electromagnetic force due to the inclination of the electrode relative to horizontally disposed source material. Also disclosed in the '369 patent is the step of incorporating a "pinch gas", also commonly known as a working gas, into the working gas. A working gas is typically, an inert gas that acts to shield one or more of the electrodes, and more importantly, is ionized to establish and sustain an arc. Araya discloses using a pinch gas of Argon mixed with Hydrogen, Nitrogen, or Oxygen in order to increase the amount of heat produced.

However, U.S. Pat. No. 5,514,349 to Parker, et al. for "A SYSTEM FOR MAKING POLYCRYSTALLINED MATERIALS," disclosed a disadvantage associated with the practice of using Oxygen as a dissociable gas. Oxygen is not preferably used in a working gas because of the resulting erosion of the non-consumable electrode. The '349 patent also discloses a non-consumable electrode inclined at an angle to the source, or evaporative, material to create an elongated arc plasma tail flame. By including Nitrogen, Hydrogen or both into the working gas, the plasma tail flame temperature is increased, which will result in a more complete reaction of the evaporative material with a reaction gas such as Oxygen, Nitrogen, Helium, Air or a combination of these gases. The presence of a reaction gas enables the source material to form nano-sized compounds. For example, if the source material is Titanium which is evaporated and then exposed to a reaction gas containing some concentration of Oxygen, Titanium ($TiO_2$) polycrystalline materials may result.

The above-mentioned patents employ continuous gas injection into a vaporization chamber, which makes it necessary to include a continuous vacuum pumping system for gas circulation. Furthermore, as gas is injected into the vaporization chamber, the chamber pressure will increase. The dynamic gas injection and gas circulation will require a more sophisticated system control process for operation, increasing the complexity of this system. Although productivity has been enhanced by the above-mentioned techniques, these gas phase condensation processes still involve a great deal of technical complexity. Furthermore, gas circulation requires the addition of gas filters and valves which will require maintenance and cleaning after a period of operation, resulting in system downtime and still more system complexity. Also, continuous gas injection into the evaporation chamber, and the subsequent release of the gas from the chamber, will consume a great quantity of gas, which leads to higher operation costs.

A simplified method for evaporating materials is disclosed in U.S. Pat. No. 5,096,558 to Ehrich for "METHOD AND APPARATUS FOR EVAPORATING MATERIAL IN VACUUM." The '558 patent discloses a technique for evaporation of materials at very low pressures ($10^{-4}$ millibars to $10^{-2}$ millibars) for the purpose of coating surfaces. The method and apparatus disclosed places much emphasis on the benefit of anode evaporation. The materials disclosed for evaporation by this method are high vapor pressure, low melting temperature materials. Although this technique works well for low-melting temperature materials, anode evaporation does not create sufficiently hot cathode spots to evaporate low vapor pressure, high temperature materials. Furthermore, the operating pressure range disclosed is too low to form particles having polycrystalline structures.

An arc plasma is a low resistance electrical conductor consisting of a high-density mixture of ionized atoms or molecules, electrons, and neutral species. Because a substantial current passes between the electrodes, typically tens to hundreds of amperes, a stable arc requires a high density of conducting molecules. If the chamber pressure is above several tens of Torr, the working gases, which may be either inert or active, will act as the current transfer medium. This type of arc evaporation may be referred to as high-pressure arc evaporation. High-pressure arc produces greater thermal power and requires a higher current, and is able to raise a non-consumable electrode to a high temperature, typically thousands of degrees centigrade. A common use of high-pressure arc evaporation is in the field of thermal spray surface coating.

Low-pressure arc evaporation methods operate in a chamber at a pressure below about 10 Torr. In a low-pressure arc evaporation system, the arc is sustained by substantial evaporation of electrode materials. The arc is initiated by some means such as a high frequency ignition or simple contact ignition. Alternatively, low-pressure arc evaporation may also be referred to as vacuum arc evaporation. Basically, a vacuum arc is sustained by the vapor emitted from a consumable electrode which may be either the anode or cathode. A true vacuum arc uses the evaporated species as the primary conductor for the arc. The consumable electrode provides the medium for the current path, which makes vacuum arc technology suitable for a wide spectrum of applications for vacuum thin-film coating, however this technology is not suitable for production of polycrystalline particles. Accordingly, there exists a need for a simple, efficient technique for forming polycrystalline particles.

SUMMARY OF THE INVENTION

The present invention overcomes the limitations of the prior art by providing a method for fabricating a polycrystalline particles by gas phase condensation, comprising the steps of providing a vacuum chamber; providing a non-consumable electrode in the vacuum chamber, spatially disposing a consumable electrode adjacent to the non-consumable electrode, the consumable electrode comprising evaporative material; evacuating the vacuum chamber to between about 10 torr and 100 millitorr; creating a potential between the non-consumable electrode and the consumable electrode; initiating an arc discharge between the non-consumable electrode and the consumable electrode to form ionized vapors of the evaporative material of the consumable electrode, whereby an arc path is provided; and evaporating the consumable electrode with an arc discharge whereby vapors from the consumable electrode condense to form polycrystalline particles. In a preferred embodiment, the chamber is first evacuated to below about $10^{-5}$ Torr and then increased between about 10 torr and 100 Millitorr by providing an inert gas. Furthermore, a reaction gas may be provided to the vacuum chamber to react with the vaporized materials to form a chemical compound. The arc discharge may be initiated by contacting the consumable electrode and the non-consumable electrode. Also, the non-consumable electrode may be cooled.

Also provided is an apparatus for forming polycrystalline particles by gas phase condensation by employing arc evaporation without an arc sustaining gas, comprising a vacuum chamber; means for evacuating the vacuum chamber to a pressure between about 100 Millitorr and 10 torr; a non-consumable electrode disposed within the vacuum chamber; a consumable electrode spatially disposed adjacent to the non-consumable electrode, the consumable electrode comprising evaporative material; a power supply having a positive terminal and a negative terminal, the positive terminal connected to one of the non-consumable electrode or consumable electrode, the negative terminal connected to the other of the non-consumable electrode or consumable electrode; means for initiating an arc discharge between the non-consumable electrode and the consumable electrode to form ionized vapors whereby an arc path is provided; and means for evaporating the consumable electrode by a sustained arc discharge, whereby vapors from the consumable electrode condense to form polycrystalline particles.

DETAILED DESCRIPTION OF THE INVENTION

A vacuum arc is sustained by the vapor emitted from either the consumable electrode, and is therefore referred to as anode arc evaporation if the consumable materials evolve from the anode, or cathode arc evaporation if the vapors evolve from the cathode. Vapor from the cathode is caused by a well-known phenomenon referred to as "cathode spot", which is an arc striking spot moving swiftly from one place to another on the cathode surface. The actual size of the cathode spot is very small, and in some cases less than one micrometer. Due to its size, the current density of the cathode spot is accordingly very large, in some cases a current density of $10^6$ A/cm$^2$ have been estimated. Therefore, the cathode spot has an extremely high temperature, in some cases the temperature can reach $10^{4o}$ C. or higher. The cathode may be a cold cathode or hot cathode depending upon the materials and objective. A cold cathode is typically formed of a highly thermal conductive material and is larger in size than the anode. Furthermore, a cold cathode may be in communication with cooling means to further reduce the cathode temperature. Alternatively, a hot cathode is one that is not cooled and is permitted to operate in a non-cooled state. A hot cathode may be employed during anode evaporation, so long as the vapor pressure of the cathode is lower than, and the melting temperature is higher than, that of the anode.

During arc evaporation electrons from the cathode travel across a gap to the anode. As mentioned above, the transport medium may be an inert gas, a reactive gas mixed with an inert gas, or as in the case of low-pressure arc evaporation, evaporated materials from a consumable electrode. The medium that sustains the arc discharge is a plasma. The plasma is an ionized vapor that provides an arc path for the current to flow from the cathode to the anode. Typically, the electrode with a higher vapor pressure or lower melting point will be the consumed electrode.

Either the cathode or anode may be the consumed electrode. As stated above, if the anode is consumed, the process is referred to as anode evaporation. In this case anode vapor can rapidly condense on the surface of the cathode and may be reevaporated by the cathode spot, which reduces consumption of the cathode. When the anode is made much smaller in diameter than the cathode, the anode can be raised to very high temperature, as high as several thousands of degrees centigrade because of the low thermal mass and small cross-sectional area for thermal conductance.

Figure 1:
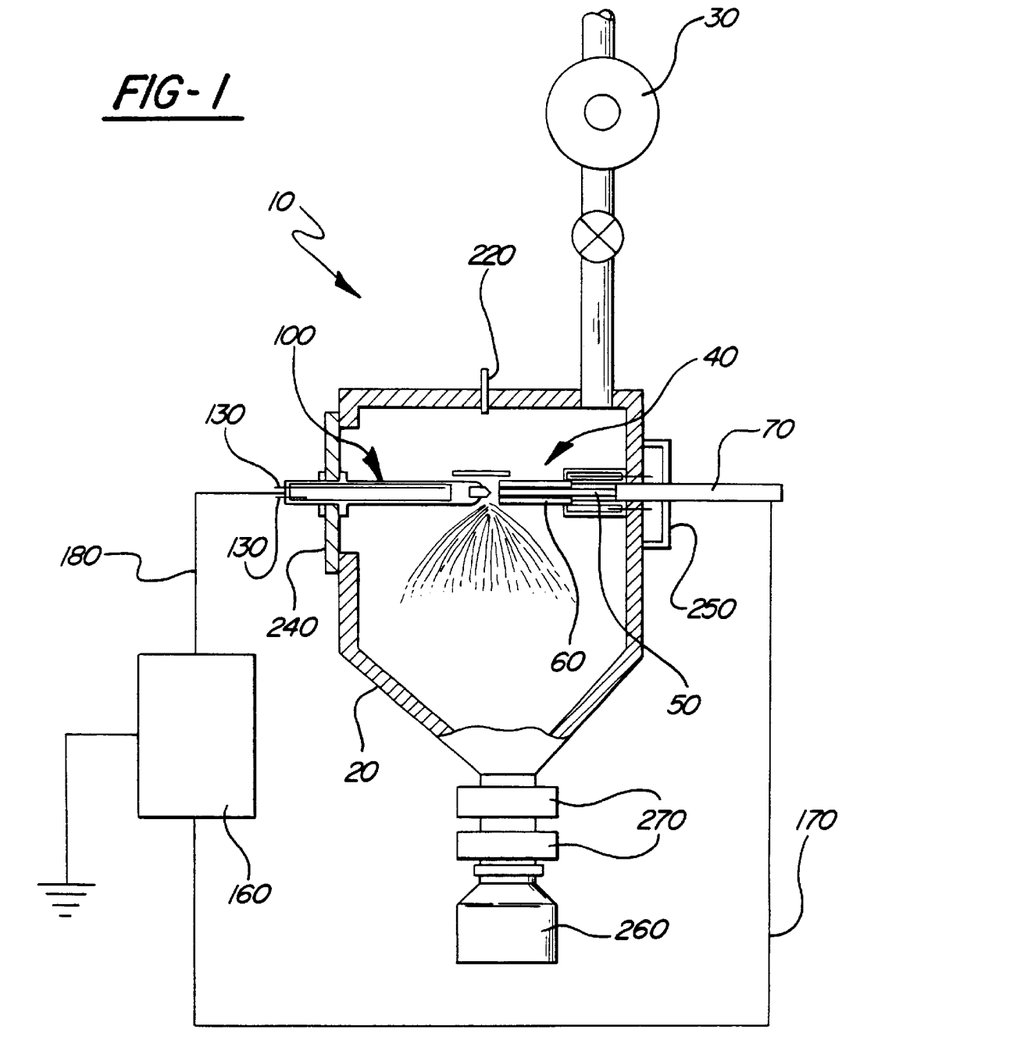
FIG. 1 is a schematic cross-sectional view of one embodiment of the apparatus according to the principles of the present invention.

The invention disclosed herein is a novel method for forming polycrystalline particles by gas phase condensation where evaporation is achieved by a plasma arc. Referring now to FIG. 1, a schematic cross-sectional illustration of an embodiment of apparatus 10 for forming polycrystalline materials by gas phase condensation is shown. The apparatus 10 includes a vacuum chamber 20 in communication with means for evacuating 30 the chamber 20 to sub-atmospheric pressure. The means for evacuating 30 may be a mechanical pump or diffusion pump, or any other suitable means known in the art for evacuating the chamber 20. The apparatus 10 further comprises a non-consumable electrode 100 disposed within the chamber 20 adjacent to a consumable electrode 40 also disposed within the chamber 20. The apparatus 10 further comprises a power supply 160 having a negative terminal 170 and a positive terminal 180, the positive terminal 180 is connected to one of either the non-consumable electrode 100 or the consumable electrode 40, and the negative terminal 170 is connected to the other of the non-consumable electrode 100 or consumable electrode 40.

Figure 2:
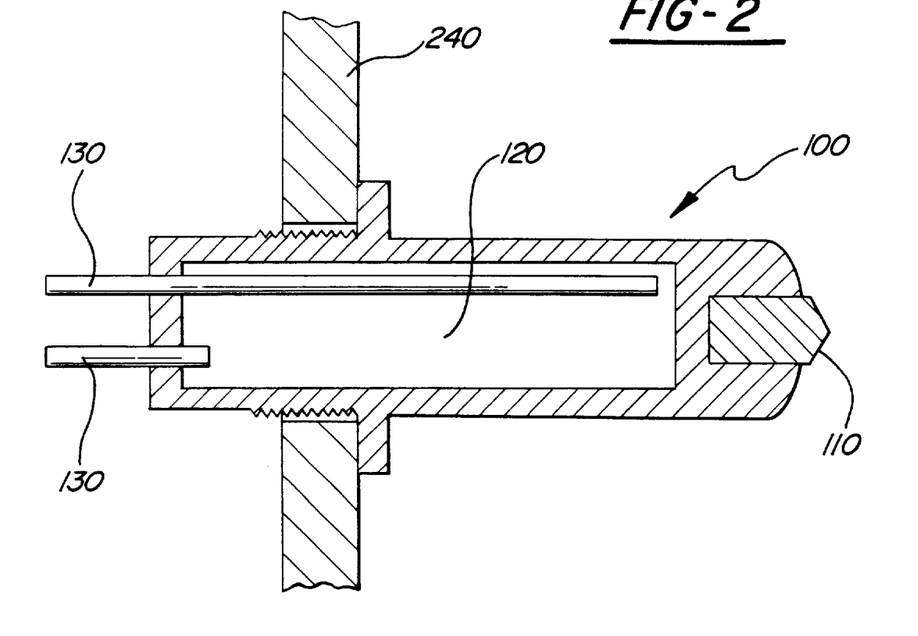
FIG. 2 is an illustration of a non-consumable electrode according to the principles of the present invention.

Referring now to FIG. 2, a schematic cross-sectional illustration of the non-consumable electrode 100 is shown. The non-consumable electrode 100 has a refractory tip 110 and may include a cavity 120. The cavity 120 may be provided to circulate a coolant to the non-consumable electrode 100 by cooling lines 130. In the preferred embodiment, the non-consumable electrode 100 is electrically isolated from the chamber 20 by non-consumable electrode isolating means 240.

Non-consumable electrode isolating means 240 is provided to prevent a short between the non-consumable electrode 100 and the chamber 20. In the exemplary embodiment isolating means 240 is a Pyrex window with an aperture therein. The non-consumable electrode 100 is disposed within the aperture of the isolating means 240. The distance between the non-consumable electrode 100 and the chamber 20, occupied by the isolating means 240 must be sufficient to avoid an arc short between the non-consumable electrode 100 and the chamber wall 20 in order for the isolating means 240 to be effective. In the preferred embodiment, the chamber wall 20 is grounded to prevent a charge accumulation.

Figure 3:
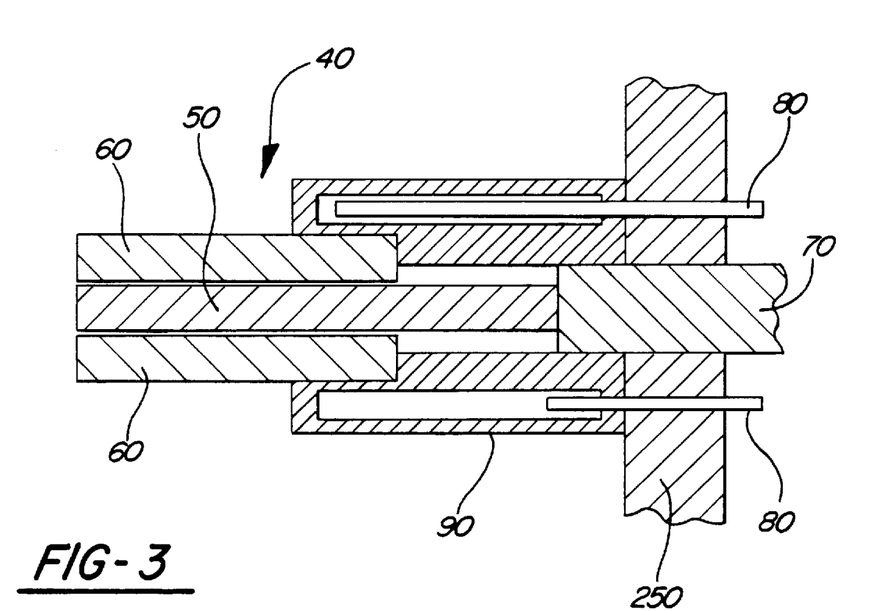
FIG. 3 is an illustration of a consumable electrode according to the principles of the present invention.

Referring now to FIG. 3, an illustration of a consumable electrode 40 according to the principles of the present invention is shown. The consumable electrode 40 includes a source or evaporative material 50 supported by a support sleeve 60. The evaporative material 50 is electrically coupled to one of either the negative terminal 170 or the positive terminal 180. In the present example, the support sleeve 60 is disposed within a consumable electrode body 90. A selectively engageable push rod 70 is provided to locate the evaporative material 50 within the chamber 20. Cooling lines 80 may also be provided to be in communication with the consumable electrode body 90. In the present embodiment, the consumable electrode 40 is electrically isolated by consumable electrode isolating means 250. In the exemplary embodiment, the consumable electrode isolating means 250 is Pyrex material with an aperture. The consumable electrode 40 is disposed within the aperture of the isolating means 250. The distance between the chamber 20 and the consumable electrode 40, occupied by isolating means 250, must be sufficient to avoid an arc discharge between the chamber 20 and the consumable electrode 40, in order for the isolating means 250 to be effective.

The apparatus 10 of the present invention operates at a pressure between about 10 torr to 100 millitorr to form polycrystalline particles, by vacuum arc evaporation. Means for evacuating 30 is in communication with the vacuum chamber 20, and in the preferred embodiment should be capable of evacuating the chamber 20 to pressure below about $10^{-5}$ torr. A gas inlet manifold 220 is provided to be in communication with the chamber 20, whereby gases such as inert, reaction, working gases, or any combination thereof may be provided to the chamber 20.

Referring again to FIG. 1, the apparatus 10 of the present invention has negative terminal 170 attached to one of the consumable electrode 40 or non-consumable electrode 100, thereby forming a cathode. The positive terminal 180 is attached to the other of the consumable electrode 40 or non-consumable electrode 100, forming an anode. During evaporation, gap exists between the consumable electrode 40 and the non-consumable electrode 100. In order for electrical current to travel from the cathode to the anode, a conductor, such as a plasma, must be present between the electrodes.

Materials evaporated from the source material 50 provide an arc path between the non-consumable electrode 100 and the consumable electrode 40. Means for initiating an arc discharge between the consumable electrode 40 and the non-consumable electrode 100 form ionized vapors from the source material 50 to provide an arc path. Any suitable means known in the art for initiating an arc discharge may be incorporated in the apparatus 10 of the present invention.

Two techniques which are known in the art for initiating an arc discharge are high-frequency ignition and contact ignition. In the preferred embodiment of the present invention the means for initiating an arc discharge is a simple contact technique.

The push rod 70 is suitably attached to the evaporative material 50. In the exemplary embodiment, the evaporative material 50 is in the form of a rod supported by the support sleeve 60 that has inner diameter sufficient to allow the evaporative material 50 to traverse the sleeve 60. The support sleeve 60 may be formed from any suitable refractory insulator, including Boron Nitride (BN) and Aluminum Oxide ($AlO_2$). In the preferred embodiment, the push rod 70 is coupled to either the negative terminal 170 or the positive terminal 180 and is formed of Copper, however, it should become apparent to those skilled in the art that any suitable alternative material may be substituted for Copper.

In the exemplary embodiment, the consumable electrode 40 is coupled to the negative terminal 170 of the power supply 160 through the push rod 70 to achieve cathode arc evaporation. As disclosed above, cathode arc evaporation has significant advantages over anode arc evaporation in that a higher temperature may be achieved with cathode arc evaporation due to the smaller size of the cathode spot than the anode spot. Although anode arc evaporation works well for low-melting temperature materials such as Magnesium, the cathode arc evaporation process of the present invention may be employed to evaporate high melting temperature transition metals including, Iron, Molybdenum, Nickel, Tungsten and Zirconium.

In the exemplary embodiment, arc discharge is initiated by contacting the consumable electrode 40 with the non-consumable electrode 100. The push rod 70 is engaged to contact the source material 50, disposed within the consumable electrode 40, with the refractory tip 110, disposed within the non-consumable electrode 100. The refractory tip 110 may be formed of any suitable material know in the art, including Tungsten, Hafnium, and Graphite. Ideally, the evaporative material 50 should have a lower melting point than the refractory tip 110. Temperature concerns may be compensated by the addition of non-consumable electrode cooling means or consumable electrode cooling means, the need for which may be determined by the source material 50, among other process parameters.

The push rod 70 is engaged whereby the evaporative material 50 contacts, or is brought into sufficiently close proximity to, the refractory tip 110, to initiate an arc discharge. The arc discharge is formed from an electrical current traveling from the cathode to the anode, creating a very high temperature, whereby a portion of the evaporative material 50 is evaporated. Ionized vapors are formed by drawing a high current through a very small spot to achieve a current density sufficient to heat a portion of the evaporative material 50 to the point of evaporation. Once vapors are formed, an arc path is provided whereby electrical current may travel from the cathode to the anode. At this point, the non-consumable electrode 100 and the consumable electrode 40 may be drawn apart to form a gap. It is within this gap that the continuous cycle of arc discharge and evaporation occurs. It is the materials that are evaporated which provide a path for the electrical current to sustain evaporation.

In the preferred embodiment the chamber 20 is prepared by evacuating the chamber 20 to below about $10^{-5}$ torr and then releasing a filling gas, an inert gas, via the gas inlet manifold 220 to the chamber 20 to increase the chamber pressure to between about 100 Millitorr and 10 torr. This step may be repeated a number of times in order to remove undesirable materials from the chamber 20. In the exemplary embodiment, Argon is the filling gas which is used to provide the correct chamber pressure. Pressure management means, such as a pressure control valve, is provided to maintain the chamber pressure throughout production of the polycrystalline particles.

Pressure management means provides for maintaining the pressure within the chamber 20 as the temperature within the chamber 20 increases. Also, as reaction gases are consumed, additional gases must be provided in order to maintain the chamber pressure. The chamber pressure range has been found to be an important operating parameter in the formation of polycrystalline materials.

Also, if the pressure within the chamber 20 becomes too high, the arc path will be sustained by the inert gas, as opposed to the evaporated species. If the chamber pressure becomes too low, the evaporated species will not sufficiently agglomerate, resulting in thin film deposition.

Once the arc discharge is initiated by contact of the electrodes, 40 and 100, and separation, the source material 50 is evaporated to sustain the arc discharge. In the preferred embodiment, the non-consumable electrode 100 has a larger diameter than the consumable electrode 40. It should be noted that although the present invention discloses electrodes with a round cross-section, any suitable electrode geometry may be substituted. The larger diameter will assist the non-consumable electrode 100 in maintaining a lower operating temperature because of the larger thermal mass. By reducing the operating temperature of the non-consumable electrode 100, the likelihood that the refractory tip 110 will evaporate is reduced. In the exemplary embodiment, the non-consumable electrode 100 has a diameter of about 1 inch (1") and is sufficiently cooled by non-consumable electrode cooling means 140, and the consumable electrode 40 has a diameter of about ¼ inch (¼") or less. The support sleeve 60 insulates the sides of the rod-shaped evaporative material 50, preventing evaporation. Furthermore, the support sleeve 60 also prevents the evaporative material 50 from collapsing, as it is not uncommon for the evaporative material 50 to melt since a substantial vapor is only attainable at a temperature higher than the melting point of the evaporative material 50.

As stated above, the arc discharge at pressures below about 10 torr are primarily supported by the vapor from the consumable electrode 40, and more specifically the evaporative material 50 that actually acts as a tip for the consumable electrode 40. Since the arc discharge of the present invention is primarily supported by the evaporative material, a large portion of the vapor is ionized. The plasma which is sustained within the gap between the non-consumable electrode 100 and the consumable electrode 40 is propelled away from the arc discharge, or plasma region, due to the high energy of the ionized species, the high temperature of the plasma region, and the pressure difference between the plasma region and the surrounding atmosphere. As the mixture of positively-charged ions and neutral atomic species move quickly away from the plasma region, electric charge is lost by capturing electrons, and thermal energy is lost by emitting light. As the expansion continues, the vaporized species collide with each other or with gases within the chamber. As stated above, the gases within the chamber may be filling gases, i.e. inert gases such as Argon or Helium. Also reactive gases such as Oxygen, Nitrogen, and Hydrogen, may be provided to the chamber 20 to react with evaporated species to form molecular oxides, nitrides, and hydrides. Eventually, the vaporized species or reaction products lose most of their thermal energy and become super-saturated. The super-saturated vapor nucleates homogeneously to form polycrystalline clusters. The chamber pressure controls the nucleation rate of the polycrystalline particles, resulting in particle sizes between about 150 nanometers and 200 nanometers. The polycrystalline particles eventually settle within the vacuum chamber 20 and are guided into a particle collection vessel 260 by any suitable means known in the art. The particle collection vessel 260 may be isolated from the vacuum chamber 20 by one or more valves 270.

Figure 4:
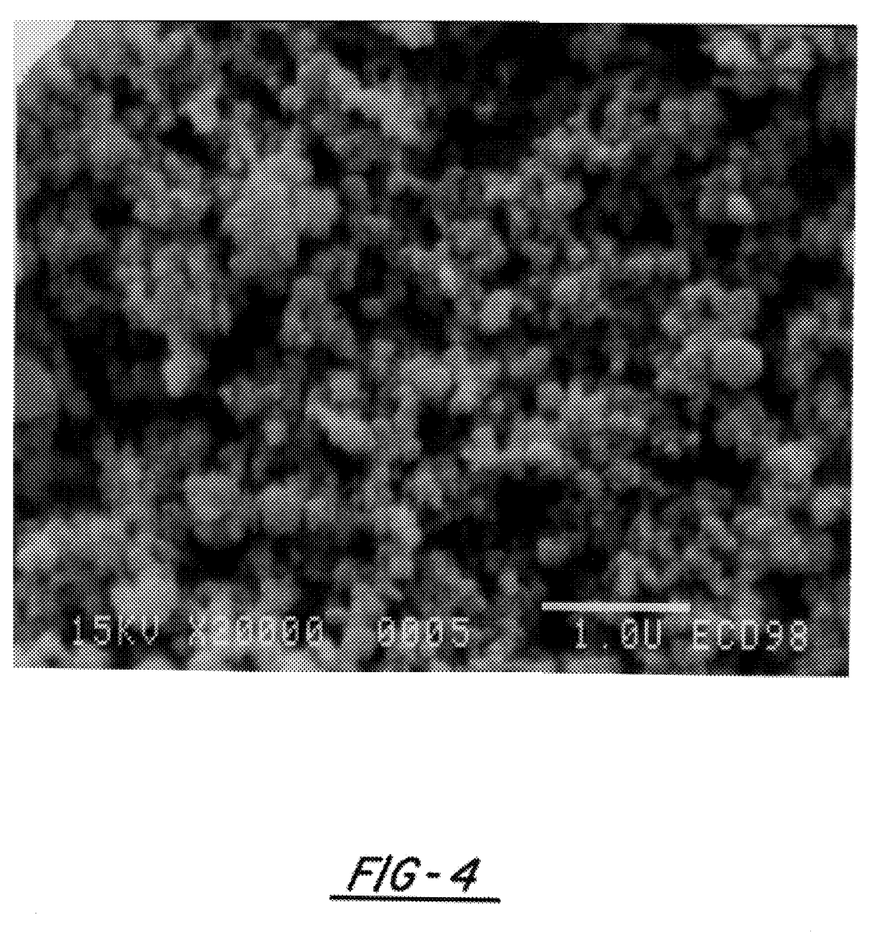
FIG. 4 is an SEM Micrograph of polycrystalline Mg particles prepared by arc plasma gas plasma condensation at a pressure of 5 torr.

Referring now to FIG. 4, a scanning electron microscope micrograph of polycrystalline Magnesium particles prepared by the present invention is shown. Close inspection of the micrograph reveals particle sizes between about 100 and 200 nanometers in diameter. A number of particles agglomerated together form particle clusters.

Figure 5:
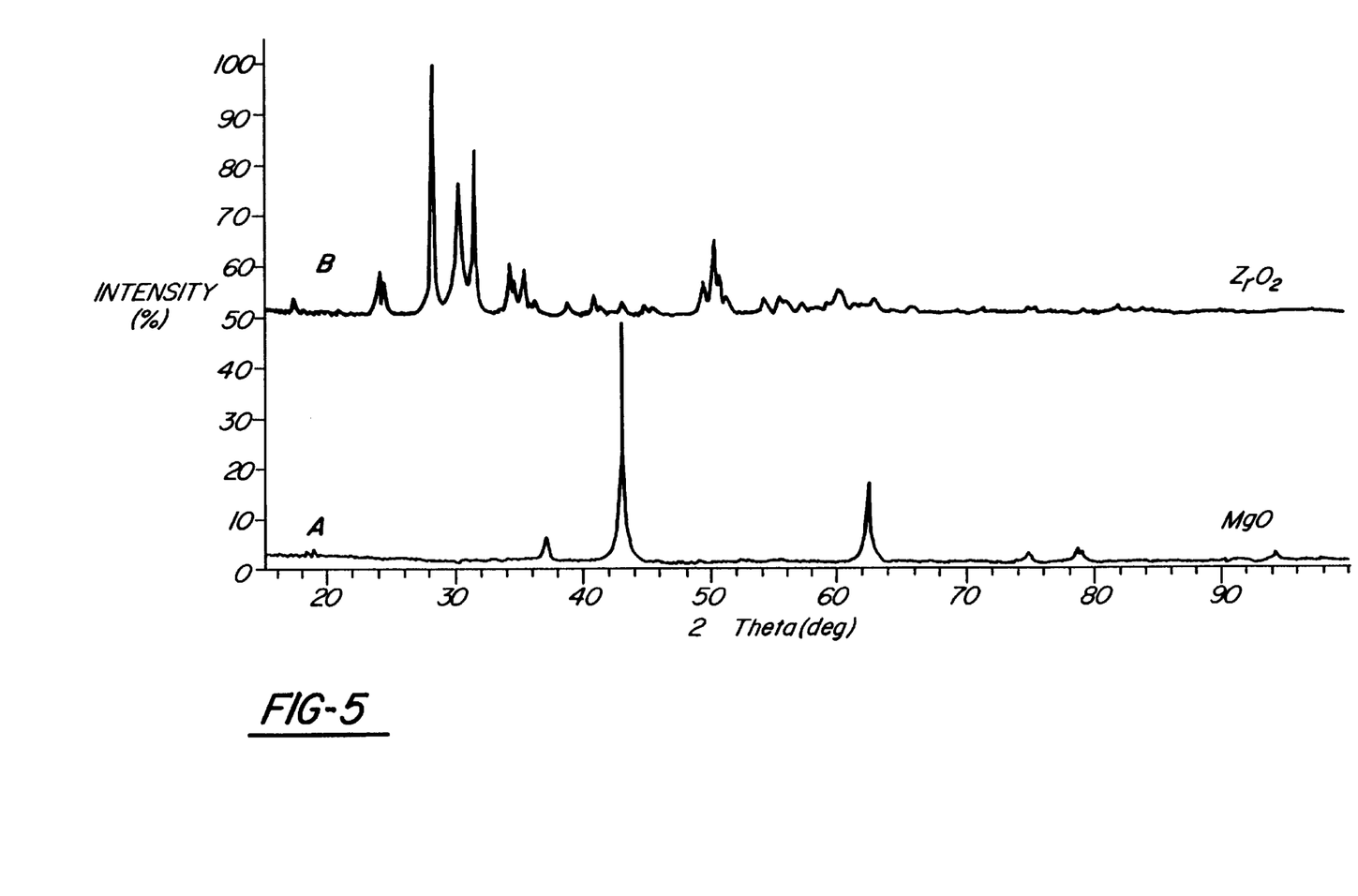
FIG. 5 is a graphical representation of an x-ray diffraction pattern for MgO (indicated by "A") and $ZrO_2$ (indicated by "B").

Referring now to FIG. 5, a graphical representation of an x-ray diffraction pattern for Magnesium Oxide, indicated by "A" and Zirconium Oxide indicated by "B" is shown, where the X-axis is intensity and the Y-axis is the angle of refraction, also known as 2 theta. The intensity spikes of line "A" of FIG. 5 show that Magnesium Oxide was indeed produced. The spikes of line "B" of FIG. 5 indicate two separate species of Zirconium Oxide were formed.

The apparatus 10 and method of the present invention requires a relatively low power to form polycrystalline particles. Generally, the voltage required is between about 18–26 volts, and the current is between about 20–50 amps. The present invention can form 40 grams of Magnesium per hour at a voltage of 20 volts and current of less than about 50 amps. For very-high melting temperature materials such as Zirconium, 1 to 2 grams per hour may be formed at a voltage of 24 volts and current of less than about 50 amps. The present invention has demonstrated a very high yield with relatively lower power in the formation of polycrystalline particles. Therefore, it has been shown that the simplicity of the present invention along with the low power requirements make the present invention a well received addition to the art of gas phase condensation by arc plasma.

EXAMPLE 1

Magnesium is a material that has a high vapor pressure at temperatures above 600° C. The high vapor pressure at a relatively low temperature renders Magnesium a candidate for efficient polycrystalline particle production by arc plasma gas phase condensation because of the temperature requirements for evaporation. A Magnesium rod having a diameter of about one half inch (½") was provided as the consumable electrode, and more specifically as an anode as it is connected to the positive terminal of a DC power supply. However, it should be noted that the polarity of the Magnesium rod may be switched to make it a consumable cathode.

The chamber was first evacuated by mechanical pumping to a pressure of 20 Millitorr, and then back filled with Argon gas to a pressure of about 5 Torr. The step of pumping down the pressure of the chamber and back filling is repeated a number of times to achieve as low an Oxygen content within the chamber 20 as possible. In order to ignite the arc a direct touch separation method is used, although a high-frequency plasma can also be used to start the arc as well. The light emitted from the arc plasma is green, which is the atomic spectrum of Magnesium, indicating the majority of ionized species is Magnesium vapor. A specimen of Magnesium particulate was taken from the vessel and examined by a scanning electron microscope (SEM).

Magnesium is an active metal and, when in particle form, may be flammable when exposed to air. The precaution for handling and storing these Magnesium particles is very important. An effective way to safely collect and store the materials is in a tightly sealed container filled with an atmosphere of Argon gas. The Magnesium sample taken for analysis, which is only about ¹⁄₁₀ of a milligram, was extracted from an Oxygen-free container. The surface layer of Magnesium particles is slowly oxidized within the container to make the surface layer inactive. The details of the particle morphology and particle size of the Magnesium particulate are shown in FIG. 4. FIG. 4 shows that the particles are loosely agglomerated and that the individual particle has spherical or facet-less morphology. The particle size range is between about 100 to 200 nanometers.

EXAMPLE 2

Pure Magnesium Oxide (MgO) is a refractory ceramic material for high temperature applications such as a crucible or thermal insulator. Polycrystalline Magnesium Oxide particles have the advantage of a much lower sintering temperature than conventional materials. Sintered parts from polycrystalline Magnesium Oxide particles have a finer microstructure, which improves the toughness and machinability of the parts. In order to form Magnesium Oxide polycrystalline particles, an additional step is required beyond the steps required to form Magnesium polycrystalline particles. Either pure Oxygen or an Oxygen/inert gas mixture is provided within the chamber for the preparation of Magnesium Oxide. In the present example, a mixture of 20% (volumetric percentage) Oxygen with Argon is used. This mixture is preferred because it was observed that pure Oxygen reacts rapidly with the tip of the consumable electrode to form an oxide cap. The oxide cap significantly decreases the vaporization rate of the evaporative material, therefore the production rate of the polycrystalline oxide particles is reduced significantly. Because Magnesium has a very high vapor pressure, the Magnesium may be adapted to be evaporated from either a consumable cathode or a consumable anode. The chamber pressure of the present example for production of Magnesium Oxide is 5 Torr. The x-ray diffraction pattern of polycrystalline Magnesium Oxide particles is shown in FIG. 5 as graph "A".

EXAMPLE 3

Zirconium (Zr) is a material that has a high melting point and a low vapor pressure, therefore thermal evaporation of this metal is extremely difficult. As discussed above, a cathode spot is distinguished from an anode spot by its spot size which is estimated to be a few micrometers or less. The temperature of a cathode spot may reach ten thousand (10,000) degrees Kelvin or higher. The present invention has demonstrated the capability to form polycrystalline particles by gas phase condensation from plasma arc evaporation of refractory materials such as Zr. In the present example, the source material, Zr, is provided in the form of a rod and electrically coupled to the negative lead of a DC power supply, therefore the Zr rod becomes a cathode. The Zr arc is very stable at a current of about 50 amps and a potential of 22 volts. In the production of Zirconium Oxide, the concentration and pressure of the Oxygen/Argon mixture within the chamber 20 is similar to the concentration and pressure for the production of Magnesium Oxide in the previous example. The yield efficiency for Zirconium Oxide is estimated to be a few grams per kilowatt hour (kWh). The x-ray diffraction pattern of polycrystalline Zirconium Oxide ($ZrO_2$) is shown in FIG. 5 as graph "B".

Therefore, it can clearly be seen that the novel teachings of the present invention show promise for commercial and industrial processing of polycrystalline particles. While the invention has been described in connection with preferred embodiments and procedures, it should be understood that it is not intended to limit the invention to the described embodiments and procedures. On the contrary, it is intended to cover all alternatives, modifications, and equivalents which may be included within the spirit and scope of the claims appended hereto.

What is claimed is:

1. A method for fabricating polycrystalline particles by gas phase condensation, comprising the steps of:

providing a vacuum chamber;

providing a non-consumable electrode within the vacuum chamber;

spatially disposing a consumable electrode adjacent the non-consumable electrode, the consumable electrode comprising evaporative material;

evacuating the vacuum chamber to between about 10 Torr and 100 mtorr;

creating a potential between the non-consumable electrode and consumable electrode;

initiating an arc discharge between the non-consumable electrode and the consumable electrode to form ionized vapors of the evaporative material of the consumable electrode, whereby an arc path is provided; and evaporating material from the consumable electrode by supplying a current to sustain an arc discharge, whereby vapors from the consumable electrode condense to form polycrystalline particles;

wherein said consumable electrode is a cathode.

2. The method of claim 1, further comprising the step of providing a reaction gas to the vacuum chamber, the reaction gas provided to react with the vaporized materials to form chemical compounds.

3. The method of claim 2, wherein the reaction gas is oxygen.

4. The method of claim 1, wherein the chamber pressure is controlled during evaporation.

5. The method of claim 1, further comprising the steps of:

evacuating the chamber to below about $10^{-5}$ Torr; and increasing the chamber pressure to between about 10 Torr and 100 mtorr by providing inert gas.

6. The method of claim 1, wherein the arc discharge is initiated by contacting the consumable electrode and non-consumable electrode.

7. The method of claim 1, wherein the non-consumable electrode is cooled.

8. The method of claim 1, wherein the evaporative material is selected from the group consisting of Iron, Molybdenum, Nickel, Tungsten and Zirconium.

9. Apparatus for forming polycrystalline particles by gas phase condensation, employing arc evaporation, comprising:

a vacuum chamber:

means for evacuating said vacuum chamber to a pressure between about 10 Torr and 100 mtorr;

a non-consumable electrode disposed within said vacuum chamber;

a consumable electrode comprising evaporative material spacially disposed adjacent said non-consumable electrode;

a power supply having a positive terminal and a negative terminal, said positive terminal connected to one of said non-consumable electrode or consumable electrode, said negative terminal connected to the other of said non consumable electrode or consumable electrode, means for initiating an arc discharge between said non-consumable electrode and said consumable electrode to form ionized vapors from said evaporative material of said consumable electrode, whereby an arc path is provided; and means for evaporating said consumable electrode, without an arc sustaining gas, by a sustained arc discharge, whereby vapors from said consumable electrode condense to form polycrystalline particles;

wherein said consumable electrode is a cathode.

10. Apparatus of claim 9, further comprising a gas inlet manifold.

11. Apparatus of claim 10, further comprising pressure management means to control chamber pressure.

12. Apparatus of claim 9, further comprising non-consumable electrode cooling means.

13. Apparatus of claim 9, wherein the arc discharge is initiated by contacting said consumable electrode and said non-consumable electrode.

14. Apparatus of claim 9, wherein said non-consumable electrode is cooled.

15. Apparatus of claim 9, wherein said evaporative material is a transition metal.

16. Apparatus of claim 15, wherein said evaporative material is selected from the group consisting of Iron, Molybdenum, Nickel, Tungsten and Zirconium.

* * * * *